United States Patent [19]

Shin et al.

[11] Patent Number: 4,862,236
[45] Date of Patent: Aug. 29, 1989

[54] HGMNCDTE AVALANCHE PHOTODIODE

[75] Inventors: Soo H. Shin; John G. Pasko, both of Thousand Oaks, Calif.; J. R. Anderson, Hyattsville, Md.

[73] Assignee: Rockwell International Corporation, El Segundo, Calif.

[21] Appl. No.: 227,585

[22] Filed: Aug. 2, 1988

[51] Int. Cl.[4] .................... H01L 27/22; H01L 27/14; H01L 29/223
[52] U.S. Cl. ...................... 357/30; 357/16; 357/61; 357/27
[58] Field of Search ................ 357/16, 61, 30, 27

[56] References Cited

U.S. PATENT DOCUMENTS

| 3,818,328 | 6/1974 | Zinn | 357/27 |
| 4,599,728 | 7/1986 | Alavi et al. | 357/61 |
| 4,731,641 | 3/1988 | Matsushima et al. | 357/30 |
| 4,801,990 | 1/1989 | Carpenter et al. | 357/61 |
| 4,813,049 | 3/1989 | Becla | 357/61 |

OTHER PUBLICATIONS

Amirtharaj et al., Solid State Comms., vol. 39, pp. 35–39, Pergamon 1981, "Electroreflectance . . . Alloy $Hg_{1-x}Mn_xTe$".
Becla, Infrared Photovoltaic Detectors Utilizing HgMnTe and HgCdMnTe Alloys, Journal of Vacuum Science and Technology A, vol. 4, p. 2014 (Jul/Aug 1986).
Chu, et al., HgMnTe-CdTe Superlattices Grown by Molecular Beam Epitaxy, Applied Physics Letters, vol. 50, p. 597 (9 Mar. 1987).
Gunshor, et al., Diluted Magnetic Semiconductor Superlattices, Journal of Crystal Growth, vol. 72, p. 294 (1985).
Harris, et al., Growth and Properties of Dilute Magnetic Semiconductor Superlattices Containing HgMnTe, Appl. Phys. Lettsl, vol. 49, p. 173 (22 Sep. 1986).
Hass, et al., Empirical Tight Binding Description of HgMnTe and HgCdTe, J. of Vacuum Science and Technology A, vol. 1, p. 1678 (Jul.–Sep. 1983).
Janik, et al., Photovoltaic Effect and Carrier Transport Mechanisms in HgMnTe Diodes, Journal of Electronic Materials, vol. 16, p. 381 (1987).
Kremer, et al., Composition Gradients and Segregation in HgMnTe, Journal of Crystal Growth, vol. 75, p. 415 (1986).
Niewodniczanska-Zawadzka, et al., Band Structure Study of Quaternary Semimagnetic HgMnTe, J. of Crystal Growth, vol. 72, p. 398 (1985).
Shih, et al., Photoemission Studies of Core Level Shifts in HgCdTe, CdMnTe, and HgZnTe, J. of Vacuum Science and Technology A, vol. 5, p. 3031 (Sep./Oct. 1987).
Takeyama, et al., New Techniques for Growing Highly-Homogeneous Quaternary HgCdMnTe Single Crystals, Japanese J. of Appl. Phys., vol. 24, p. 1270 (Oct. 1985).
Wong, et al., Magnetic Field Influence on Photovoltaic Effect in Mn Alloyed Semiconductors, J. of Vac. Science and Tech. A, vol. 4, p. 2019 (Jul./Aug. 1986).

Primary Examiner—Andrew J. James
Assistant Examiner—Jerome Jackson, Jr.
Attorney, Agent, or Firm—H. Fredrick Hamann; John J. Deinken

[57] ABSTRACT

A semiconducting photodiode for detecting light at a predetermined wavelength includes a first semiconducting region having a first conductivity type which is a quaternary alloy of Hg, Mn, Cd, and Te. A second semiconducting region having a second conductivity type electrically contacts the first semiconducting region, such that a semiconducting junction is formed between the first and second regions. The relative proportions of Hg, Mn, and Cd in the first region are selected so that the bandgap energy of the first region is approximately equal to the spin orbit splitting energy of the first region at the desired wavelength.

6 Claims, 2 Drawing Sheets

HGMNCDTE AVALANCHE PHOTODIODE

GOVERNMENT RIGHTS

The United States Government has rights in this invention pursuant to a contract awarded by the National Security Agency.

BACKGROUND OF THE INVENTION

This invention is concerned with semiconducting photodiodes.

The availability of optical fibers with low attenuation and minimum dispersion in the 1.3 to 1.6 $\mu$m region has motivated research directed at the development of optical sources and photodetectors which will operate at these wavelengths so that practical fiber optical systems can be implemented in this region of the optical spectrum. The problems encountered in fabricating these devices, such as long wavelength avalanche photodiodes (APDs), have been primarily related to materials. The devices utilized in the prior art, which have been produced from germanium or Group III-V alloys, have exhibited a combination of high leakage currents, soft breakdowns, and relatively low gain. The high leakage currents of these detectors degrade the signal-to-noise performance and restrict the usable gain to low values.

Consequently, it has become desirable to identify a new photodiode technology which can provide acceptable performance in the longer wavelength region at which high performance optical fibers operate.

SUMMARY OF THE INVENTION

This invention makes possible the development of practical long wavelength infrared communications systems by introducing high performance photodiodes operable at such wavelengths.

A semiconducting photodiode for detecting light at a predetermined wavelength includes, according to this invention, a first semiconducting region having a first conductivity type which is a quaternary alloy of Hg, Mn, Cd, and Te. A second semiconducting region having a second conductivity type electrically contacts the first semiconducting region, such that a semiconducting junction is formed between the first and second regions. The relative proportions of Hg, Mn, and Cd in the first region are selected so that the bandgap energy of the first region is approximately equal to the spin orbit splitting energy of the first region at the desired wavelength.

In a more particular embodiment, the second semiconducting region is also a quaternary alloy of Hg, Mn, Cd, and Te. In addition, the first conductivity type may be p type conductivity, while the second conductivity type is n type conductivity. Alternatively, the first conductivity type may be n type conductivity and the second conductivity type p type conductivity.

The material of the first semiconducting region may, more specifically, conform to the formula $Hg_{1-x-y}Mn_xCd_yTe$, where x is approximately 0.19 and y is approximately 0.32. With this particular alloy, the photodiode is adapted to detect light at a wavelength of approximately 1.55 um. In one example, the first semiconducting region is a p-type layer epitaxially grown on a CdTe substrate, while the second semiconducting region is a boron-implanted n+ region in the p-type layer.

A method of making a semiconducting photodiode for detecting light at a predetermined wavelength, according to this invention, begins with the step of selecting relative properties of Hg, Mn, and Cd for a quaternary alloy of Hg, Mn, Cd, and Te so that the bandgap energy of the alloy is approximately equal to the spin orbit splitting energy of the alloy at the desired wavelength. A first semiconducting region is then formed with a first conductivity type out of a quaternary alloy of Hg, Mn, Cd, and Te with the selected proportions of Hg, Mn, and Cd. Finally, a second semiconducting region having a second conductivity type and electrically contacting the first semiconducting region is formed such that a semiconducting junction is formed between the first and second regions.

DESCRIPTION OF THE INVENTION

Figure 1:
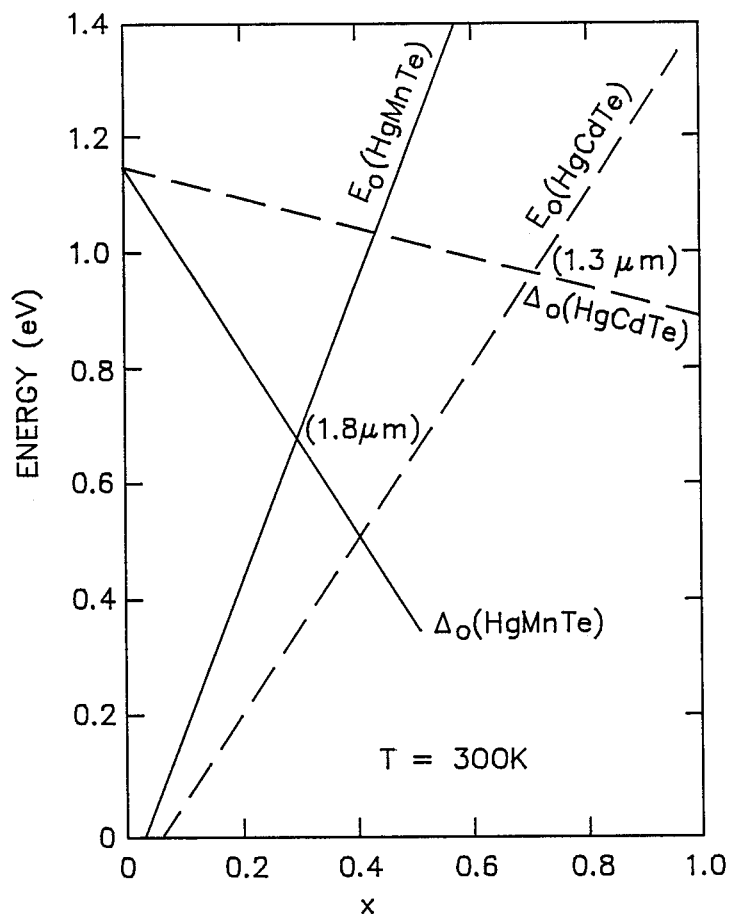
FIG. 1 is a plot depicting the variation which occurs in the bandgap energy $E_0$ and the spin-orbit splitting energy $\Delta_0$ as a function of the amount of Cd and Mn in the ternary $Hg_{1-x}Cd_xTe$ and $Hg_{1-x}Mn_xTe$ systems.

This invention provides high performance photodiodes made from HgMnCdTe alloys for long wavelength infrared avalanche photodiode (APD) applications. $Hg_{1-x}Mn_xTe$, which is sometimes referred to as a semimagnetic semiconductor, has been shown to exhibit considerable potential for infrared applications, with semiconducting properties similar to those of $Hg_{1-x}Cd_xTe$. The bandgap of this alloy can be tuned by varying the alloy composition, low carrier concentrations can be achieved by stoichiometric controls, and electron mobility can exceed $10^6$ cm$^2$/V-s at liquid helium temperatures. This material has been shown to exhibit good photodiode performance, with an energy gap which can be tuned from 100 to 770 meV at 77 K.

A fundamental limitation in employing long wavelength materials in fiber optic communications systems is associated with the ionization rates for electrons ($\alpha$) and holes ($\beta$). According to McIntyre's rule (McIntyre, Multiplication Noise in Uniform Avalanche Diodes, IEEE Transactions on Electron Devices, Volume ED-13, Page 164 (1966), the noise performance of an avalanche photodiode can be improved by more than a factor of 10 when the $\beta/\alpha$ ionizatin rate ratio is increased to 5. The excess noise in an APD is greatly reduced when the carrier with the largest ionization coefficient is injected into the high field region. Consequently, in optimizing the performance of an APD it is essential to identify materials and device structures which have very different electrons and hole ionization coefficients. This condition is met in silicon, for example, where $\alpha/\beta$ is 20 or more. $\alpha$ and $\beta$ are comparable in value, however, for most of the materials which can be used in the long wavelength (1.3-1.8 um) range, so that, for these materials, $\beta/\alpha \leq 2$. Germanium, for example, has a ratio of 1.4, while the ratio for InGaAs is only slighly better at 2.5.

It is an outstanding feature of this invention to provide a technique by which photodiodes made from $Hg_{1-x-y}Mn_xCd_yTe$ alloys can be optimized to produce high performance in long wavelength APD applications. We have discovered that HgTe-based alloy systems can be configured to offer the same advantage for low noise APDs as does the GaAlSb system, namely, a resonantly enhanced ionization ratio. The $\beta/\alpha$ ratio of $Hg_{0.3}Cd_{0.7}Te$, for example, is approximately 10 at a wavelength of 1.3 um. Since the band structure and electrical properties of $Hg_{1-x}Mn_xTe$ are quite similar to the HgCdTe system, a similar resonance effect should be expected at a longer wavelength of $\lambda=1.8$ um. Furthermore, theoretical calculations have shown that the addition of Mn in the HgTe alloy may have the desirable effect of strengthening the Hg-Te bond, resulting in improved material quality. These calculations suggest that the resonance condition can be obtained for a 1.55 um photodiode with the quaternary alloy $Hg_{1-x-y}Mn_xCd_yTe$ by making an appropriate choice for the composition variables x and y.

FIG. 1 is a plot depicting the variation which occurs in the bandgap energy $E_0$ and the spin-orbit splitting energy $\Delta_0$ as a function of the amount of Cd and Mn in the ternary $Hg_{1-x}Cd_xTe$ and $Hg_{1-x}Mn_xTe$ alloy systems. As indicated in FIG. 1, the $Hg_{1-x}Cd_xTe$ system provides an $E_0=\Delta_0$ resonance at 1.3 um, while the $Hg_{1-x}Mn_xTe$ system exhibits a resonance at 1.8 um.

To calculate the necessary composition of $Hg_{1-x-y}Mn_xCd_yTe$ to achieve resonance at 1.55 um, analytical expressions are obtained by fitting electroreflectance data for $Hg_{1-x-y}Mn_xCd_yTe$ (from Amirtharaj, Electroreflectance Study of the Dilute Magnetic Semiconductor Alloy $Hg_{1-x}Mn_xTe$, Solid State Communications, Volume 39, Page 35 (1981)):

$$E_0(x,y) = -0.12 + 2.61x + 1.14y + 0.48y^2 \quad (1)$$

and $$\Delta_0(x,y) = 1.17 - 1.5717x - 0.246y \quad (2)$$

Solving equations (1) and (2) yields values of x=0.19 and y=0.32, for a bandgap of approximately 0.8 eV, which corresponds to 1.55 um in $Hg_{1-x-y}Mn_xCd_yTe$.

Figure 2:
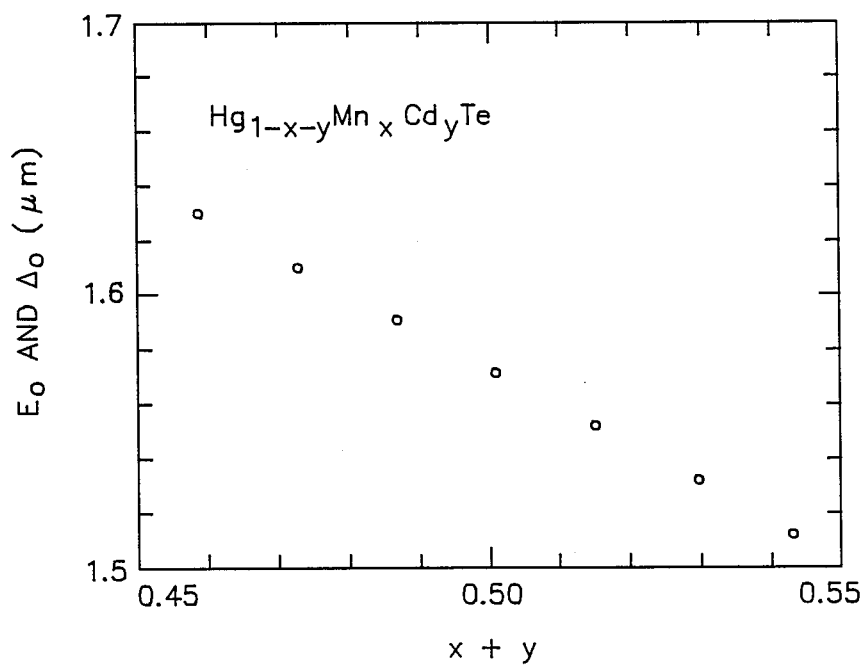
FIG. 2 is a plot of the value of the resonance energy $E_0 = \Delta_0$ as a function of the composition variable $x+y$.

The value of resonance energy $E_0=\Delta_0$ is plotted as a function of the composition variable x+y in FIG. 2. It is evident from this plot that $E_0$ and $\Delta_0$ can be tuned within the range of approximately 1.5–1.6 um for the $Hg_{1-x-y}Mn_xCd_yTe$ system.

In the prior art, quaternary $Hg_{1-x-y}Mn_xCd_yTe$ alloys have been prepared either by depositing epitaxial layers using isothermal vapor phase epitaxy (ISOVPE) or by producing bulk samples with the modified two-phase mixture (MTPM) crystal growth method. The ISOVPE technique enables smooth, mirror-like, and terrace-free films of HgMnCdTe to be grown on CdMnTe substrates. Such a HgMnCdTe layer, however, will contain large composition gradients across its surface, due to the interdiffusion of HgTe and $Cd_{1-x}Mn_xTe$. Consequently, the ISOVPE method cannot be used to grow homogeneous HgMnCdTe epilayers suitable for fabricating photodiodes. Moreover, the alternative modified two-phase mixture method has been found only partially successful for growing a single crystal with a few grain boundaries.

Because of these limitations in the prior art growth techniques, the liquid phase epitaxy (LPE) growth method has been selected for the growth of HgMnCdTe photodiode material, since this method offers the potential for high quality and uniformity over a large area of the grown material. LPE is presently the most widely used technique for the growth of II-VI epitaxial materials and has been applied successfully to HgCdTe for the fabrication of detector arrays. Since the lattice mismatch between a CdTe substrate and a $Hg_{0.49}Mn_{0.19}Cd_{0.32}Te$ epilayer is less than 0.6%, this slight amount of lattice mismatch should not be a problem for the LPE growth of 1.55 um $Hg_{1-x-y}Mn_xCd_yTe$. If it is desirable to avoid any mismatch, however, $Hg_{0.49}Mn_{0.19}Cd_{0.32}Te$, which has a lattice constant of 6.444 Å, can be grown on $Cd_{0.75}Mn_{0.25}Te$ with exact lattice matching.

In preparing some particular embodiments according to the present invention, a vertical furnace containing high pressure hydrogen or argon gas and a quartz tube was used for the growth of HgMnCdTe epitaxial layers on semi-insulating (111) Te-oriented CdTe substrates. A Te-rich solution of HgMnCdTe was employed for the LPE growth. The source materials, Hg, Mn, CdTe, and excess Te metal, were loaded into the growth quartz tube in the furnace. After the source materials were reacted at 700°–750° C. for 60 minutes, the melt was cooled to the saturation temperature of approximately 550° C. The growth time was adjusted to produce layers with thicknesses in the range of 10-15 um. For all compositions, the quantities of HgCdTe and Mn in the melt were experimentally adjusted to achieve the required composition. $Hg_{1-x-y}Mn_xCd_yTe$ layers covering the range from 1.25 to 1.55 um have been grown. The microscopic surface morphologies of the HgMnCdTe epitaxial layers were characterized by terraced structures similar to the typical surface morphology of HgCdTe layers.

Since the epitaxial layers were grown in Te-rich solutions above 500° C., the unintentionally doped epitaxial layers contained native acceptors presumed to be cation vacancies. The typical epilayer showed an acceptor carrier concentration on the order of $1.0-7.0 \times 10^{16}$ $cm^{-3}$ and a hole mobility of 30-50 $cm^2$/V-s at room temperature. At 77 K., the acceptor concentration dropped to $1 \times 10^{15}$ $cm^{-3}$, while the hole mobility increased to 140 $cm^2$/V-s.

To demonstrate HgMnCdTe photodiode performance, a mesa-type photodiode was fabricated in the LPE-grown material and characterized. The photodiode structure consisted of a boron-implanted mosaic fabricated on a p-type LPE $Hg_{1-x-y}Mn_xCd_yTe$ layer grown on a CdTe substrate. Conventional lithographic techniques were used during the diode processing. The $n^+$ region, with an area of $1.6 \times 10^{-4}$ $cm^2$, was formed by an ion dose of $1 \times 10^{14}$ $cm^{-2}$ at an energy of 200 KeV. The implanted samples received post-implant annealing at 200° C. Bonded contacts to both implanted and unimplanted regions provided electrical contacts for diode and ground connections.

The 1.54 um HgMnCdTe photodiode exhibited a $V_B$ of 50 V defined at $I_D=10$ uA. This value is comparable to those of Ge or InGaAs avalanche photodiodes. The background carrier concentration of Ge was on the order of $5 \times 10^{16}$ $cm^{-3}$; therefore, the $V_B$ value of a Ge photodiode should be similar to the HgMnCdTe photodiode, since the $V_B$ value is strongly dependent on doping levels for a given energy gap ($E_g$). The leakage current of the photodiode was $1.5 \times 10^{-4}$ A/$cm^2$, which is relatively low for a 1.5 um photodiode application and is comparable to some III-V photodiodes.

Figure 3:
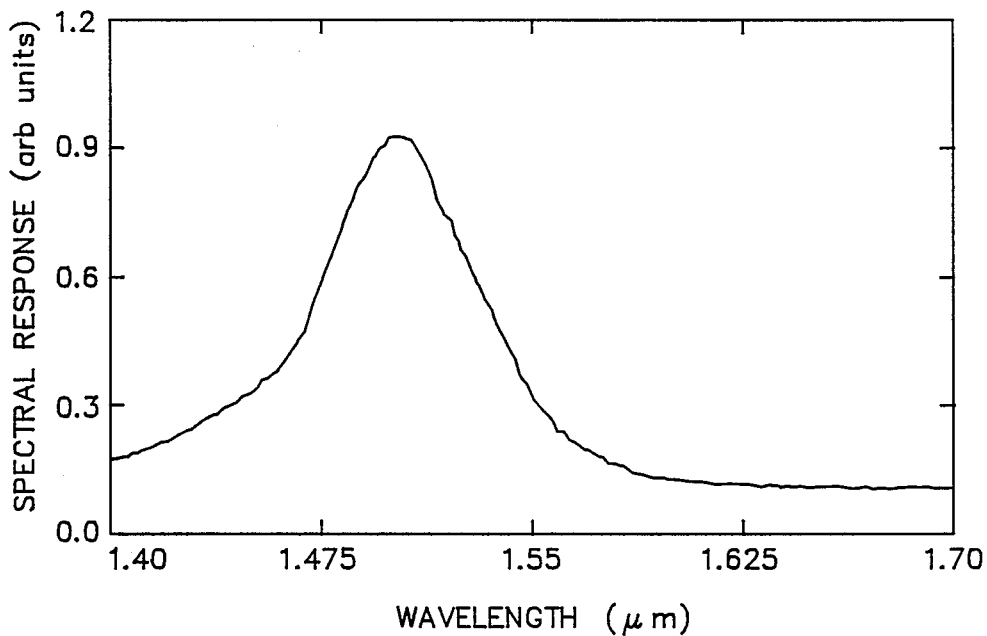
FIG. 3 is a plot of the spectral response of a photodiode constructed according to the invention, measured under conditions of zero bias and frontside illumination.

FIG. 3 is a plot of the spectral response of the photodiode, measured under conditions of zero bias and frontside illumination. The cutoff wavelength was 1.54 um at room temperature. The narrow spectral response of this photodiode might have been due to surface recombination or to calibration problems during the measurement. The resistance-area product ($R_oA$) estimated from the saturation current was $2.62 \times 10^2 \Omega\text{-cm}^2$. This would be equivalent to a detectivity ($D^*$) value of $1.9 \times 10^{11}$ cm $Hz^{\frac{1}{2}}/W$ at 300 K., assuming that the noise current was dominated by detector thermal noise at low background and that the quantum efficiency was 60%.

Figure 4:
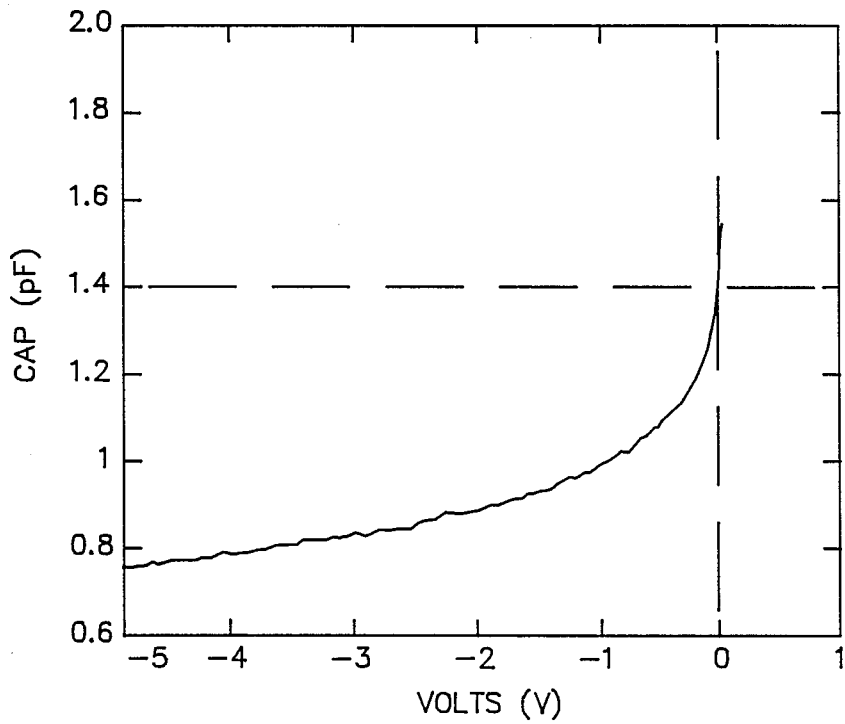
FIG. 4 is a plot depicting the capacitance of the photodiode as a function of the reverse bias applied to the photodiode.

FIG. 4 is a plot depicting the capacitance of the photodiode as a function of the reverse bias applied to the photodiode. A 0.75 pF capacitance was measured under a 5 V reverse vias at 295 K. This value is three times smaller than that of a commercial germanium photodetector measured at 195 K. (9 pF for $4.6 \times 10^{-4}$ cm$^2$ Ge detectors at 195 K.). These results demonstrate the feasibility of using LPE-grown HgMnCdTe photodiodes for 1.55 um long-wavelength applications.

In conclusion, HgMnCdTe photodiodes fabricated according to this invention have demonstrated performance which is equal to or superior than the photodiodes available in the prior art in the 1.54 um wavelength range. This quaternary technology promises to be of pratical importance for fiber optic communication systems operating in the range of 1.3 to 1.8 um.

The preferred embodiments of this inventin have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

The teaching of the following documents, which are referred to herein, is incorporated by reference: McIntyre, Multiplication Noise in Uniform Avalanche Diodes, IEEE Transactions on Electron Devices, Volume ED-13, Page 164 (1966); Amirtharaj, Electroreflectance Study of the Dilute Magnetic Semiconductor Alloy $Hg_{1-x}Mn_xTe$, Solid State Communications, Volume 39, Page 35 (1981).

We claim:

1. A semiconducting photodiode for detecting light at a predetermined wavelength, comprising:
   a first semiconducting region having a first conductivity type and comprising a quaternary alloy of Hg, Mn, Cd, and Te; and
   a second semiconducting region having a second conductivity type and electrically contacting the first semiconducting region, such that a semiconducting junction is formed between the first and second regions,
   the relative proportions of Hg, Mn, and Cd in the first region being selected so that the bandgap energy of the first region is approximately equal to the spin orbit splitting energy of the first region at the predetermined wavelength.

2. The photodiode of claim 1, wherein the second semiconducting region further comprises a quaternary alloy of Hg, Mn, Cd, and Te.

3. The photodiode of claim 1, wherein the first conductivity type further comprises p type conductivity and the second conductivity type further comprises n type conductivity.

4. The photodiode of claim 1, wherein the first conductivity type further comprises n type conductivity and the second conductivity type further comprises p type conductivity.

5. The photodiode of claim 1, wherein the first semiconducting region further comprises $Hg_{1-x-y}Mn_xCd_yTe$, where x is approximately 0.19 and y is approximately 0.32, such that the photodiode is adapted to detect light at a wavelength of approximately 1.55 um.

6. The photodiode of claim 5, wherein the first semiconducting region further comprises a p-type layer epitaxially grown on a CdTe substrate and the second semiconducting region further comprises a boron-implanted n+ region in the p-type layer.

* * * * *